(12) United States Patent
Klein et al.

(10) Patent No.: US 12,710,806 B2
(45) Date of Patent: Aug. 18, 2026

(54) ON DEMAND CONTEXTUAL SUPPORT AGENT WITH SPATIAL AWARENESS

(71) Applicant: Microsoft Technology Licensing, LLC, Redmond, WA (US)

(72) Inventors: Andrew Jackson Klein, Vancouver (CA); Jonathon Burnham Cobb, Vancouver (CA); Benjamin James Andrews, Seattle, WA (US); Raymond Alexander Chi Yuen Lum, Vancouver (CA); Darren Alexander Bennett, Vancouver (CA); Daniel Mark Bernard, Lombard, IL (US); Aaron Daniel Krauss, Lancaster, OH (US); Robert Istvan Butterworth, Burnaby (CA); Preetinderpal Singh Mangat, Surrey (CA); Amanda Jane Hillman, North Bend, WA (US); David Binh Quang Tran, Redmond, WA (US); Jeremy Bruce Kersey, Vancouver (CA)

(73) Assignee: Microsoft Technology Licensing, LLC, Redmond, WA (US)

( * ) Notice: Subject to any disclaimer, the term of this patent is extended or adjusted under 35 U.S.C. 154(b) by 313 days.

(21) Appl. No.: 18/388,609

(22) Filed: Nov. 10, 2023

(65) Prior Publication Data

US 2025/0155961 A1 May 15, 2025

(51) Int. Cl.

| | |
|---|---|
| ***G06T 19/00*** | (2011.01) |
| ***G02B 27/01*** | (2006.01) |

(Continued)

(52) U.S. Cl.
CPC .......... *G06F 3/011* (2013.01); *G02B 27/0103* (2013.01); *G06F 16/909* (2019.01);
(Continued)

(58) Field of Classification Search
CPC .................................................... G06T 19/006
See application file for complete search history.

(56) References Cited

U.S. PATENT DOCUMENTS

| | | | |
|---|---|---|---|
| 10,559,086 B1 * | 2/2020 | Miller | H04N 23/45 |
| 2018/0276872 A1 * | 9/2018 | Case | G06T 19/006 |

(Continued)

OTHER PUBLICATIONS

Wang, et al., "HoloAssist: A multimodal dataset for next-gen AI copilots for the physical world", In Proceedings of IEEE/CVF International Conference on Computer Vision(opens in new tab), Oct. 5, 2023, 8 Pages.

*Primary Examiner* — Phong X Nguyen
(74) *Attorney, Agent, or Firm* — Workman Nydegger

(57) ABSTRACT

Techniques for toggling a visibility of tagged spatial data and for correlating the tagged spatial data with output of an LLM are disclosed. Scene data describing a real-world scene in which a 3D object is located is accessed. A digital file that models the 3D object is accessed. The digital file includes tagged spatial data associated with the 3D object. User input is received. The user input is directed to the 3D object. The digital file and the user input are provided as input to the LLM. The LLM correlates the user input with the tagged spatial data and generates a response. While the LLM's response is being provided to the user, a display of a hologram is toggled, where this hologram overlays at least a portion of the 3D object.

20 Claims, 17 Drawing Sheets

(51) Int. Cl.

| | |
|---|---|
| ***G06F 3/01*** | (2006.01) |
| ***G06F 16/909*** | (2019.01) |
| ***G06F 40/40*** | (2020.01) |
| ***G06T 17/00*** | (2006.01) |
| ***G06T 19/20*** | (2011.01) |
| *G06F 30/10* | (2020.01) |

(52) U.S. Cl.
CPC .............. *G06F 40/40* (2020.01); *G06T 17/00* (2013.01); *G06T 19/20* (2013.01); *G02B 2027/0174* (2013.01); *G06F 30/10* (2020.01)

(56) References Cited

U.S. PATENT DOCUMENTS

| | | | | |
|---|---|---|---|---|
| 2020/0302510 | A1* | 9/2020 | Chachek | G06V 20/52 |
| 2023/0118119 | A1* | 4/2023 | Chachek | G06V 10/803<br>705/14.72 |
| 2023/0351706 | A1* | 11/2023 | Babinowich | G06T 7/579 |
| 2024/0119932 | A1* | 4/2024 | Khorshid | G10L 15/22 |
| 2024/0419246 | A1* | 12/2024 | Ullrich | G10L 13/08 |
| 2024/0419905 | A1* | 12/2024 | Mai | G06N 20/00 |
| 2025/0037391 | A1* | 1/2025 | Nguyen | G06T 19/006 |
| 2025/0054048 | A1* | 2/2025 | Konakalla | G06T 19/006 |
| 2025/0103052 | A1* | 3/2025 | Klingensmith | G05D 1/246 |
| 2025/0155961 | A1* | 5/2025 | Klein | G02B 27/0103 |
| 2025/0156720 | A1* | 5/2025 | Gaier | G06F 30/13 |
| 2025/0321987 | A1* | 10/2025 | Yuan | G06F 16/3329 |

* cited by examiner

Figure 9B:
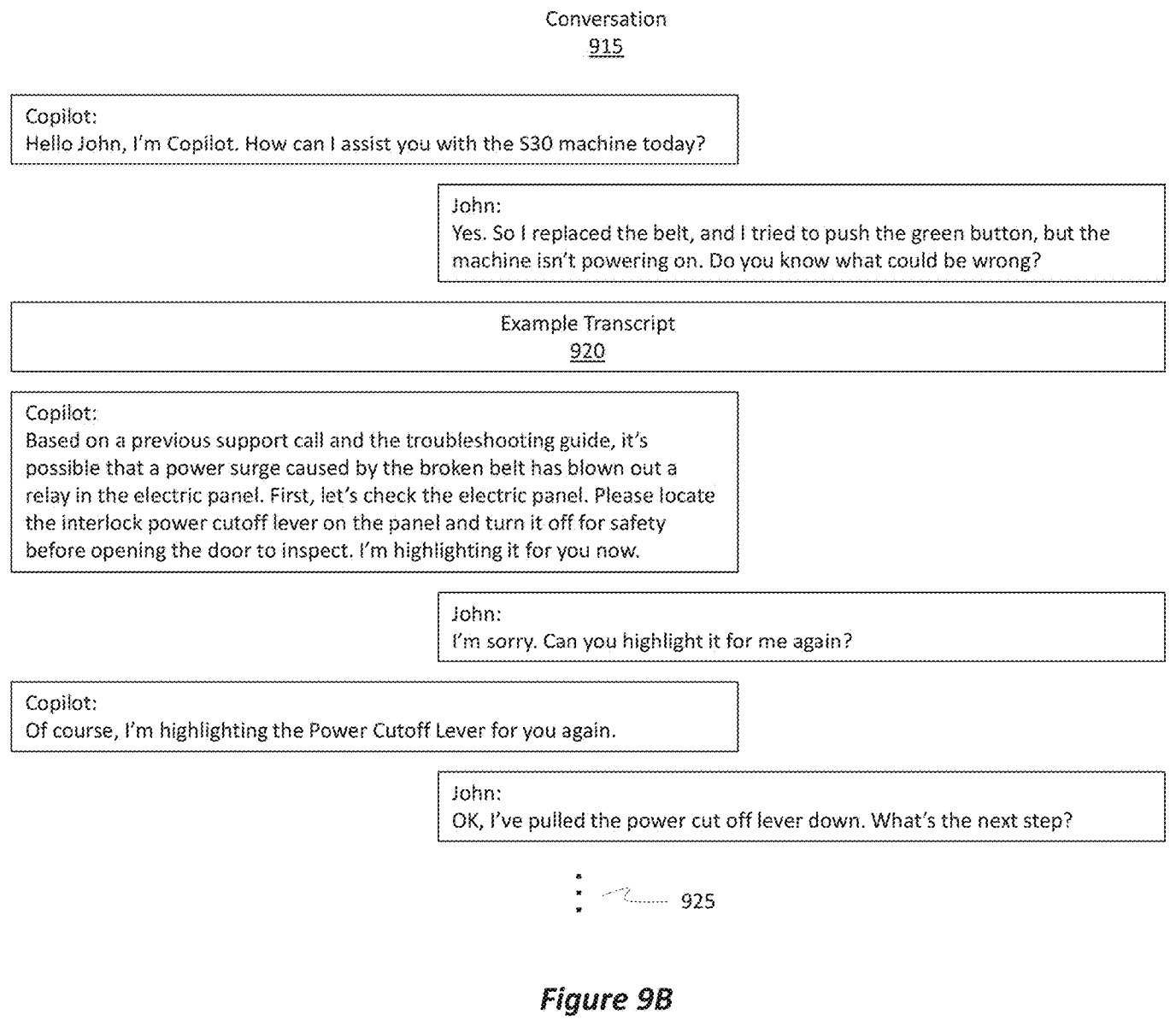

Conversation
915

Copilot:
Hello John, I'm Copilot. How can I assist you with the S30 machine today?

John:
Yes. So I replaced the belt, and I tried to push the green button, but the machine isn't powering on. Do you know what could be wrong?

Example Transcript
920

Copilot:
Based on a previous support call and the troubleshooting guide, it's possible that a power surge caused by the broken belt has blown out a relay in the electric panel. First, let's check the electric panel. Please locate the interlock power cutoff lever on the panel and turn it off for safety before opening the door to inspect. I'm highlighting it for you now.

John:
I'm sorry. Can you highlight it for me again?

Copilot:
Of course, I'm highlighting the Power Cutoff Lever for you again.

John:
OK, I've pulled the power cut off lever down. What's the next step?

ON DEMAND CONTEXTUAL SUPPORT AGENT WITH SPATIAL AWARENESS

BACKGROUND

Head mounted devices (HMD), or other wearable devices, are becoming highly popular. These types of devices are able to provide a so-called "extended reality" experience.

The phrase "extended reality" (XR) is an umbrella term that collectively describes various different types of immersive platforms. Such immersive platforms include virtual reality (VR) platforms, mixed reality (MR) platforms, and augmented reality (AR) platforms. The XR system provides a "scene" to a user. As used herein, the term "scene" generally refers to any simulated environment (e.g., three-dimensional (3D) or two-dimensional (2D)) that is displayed by an XR system.

For reference, conventional VR systems create completely immersive experiences by restricting their users' views to only virtual environments. This is often achieved through the use of an HMD that completely blocks any view of the real world. Conventional AR systems create an augmented-reality experience by visually presenting virtual objects that are placed in the real world. Conventional MR systems also create an augmented-reality experience by visually presenting virtual objects that are placed in the real world, and those virtual objects are typically able to be interacted with by the user. Furthermore, virtual objects in the context of MR systems can also interact with real world objects. AR and MR platforms can also be implemented using an HMD. XR systems can also be implemented using laptops, handheld devices, and other computing systems.

Unless stated otherwise, the descriptions herein apply equally to all types of XR systems, which include MR systems, VR systems, AR systems, and/or any other similar system capable of displaying virtual content. An XR system can be used to display various different types of information to a user. Some of that information is displayed in the form of a "hologram." As used herein, the term "hologram" generally refers to image content that is displayed by an XR system. In some instances, the hologram can have the appearance of being a 3D object while in other instances the hologram can have the appearance of being a 2D object.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

In some aspects, the techniques described herein relate to a method for toggling a visibility of holograms and for correlating tagged spatial data with output of a large language model (LLM), said method including: accessing scene data describing a real-world scene in which a three-dimensional (3D) object is located; accessing a digital file that models the 3D object, wherein the digital file includes tagged spatial data associated with the 3D object; receiving, in real time and from a user, user input directed to the 3D object located in the real-world scene; providing the digital file and the user input as inputs to an LLM, wherein the LLM is tasked with correlating the user input with the tagged spatial data of the digital file, and wherein the LLM is further tasked with generating a response to the user input; and while the LLM's response is being provided to the user, toggling display of a hologram that overlays at least a portion of the 3D object.

In some aspects, the techniques described herein relate to a method for toggling a visibility of holograms and for correlating the tagged spatial data with output of a large language model (LLM), said method including: accessing scene data describing a real-world scene in which a three-dimensional (3D) object is located; accessing a digital file that models the 3D object, wherein the digital file includes tagged spatial data associated with the 3D object; receiving, in real time and from a user, user input directed to the 3D object located in the real-world scene, wherein the user input includes a gesture input, wherein a hand-pointing vector is generated based on the gesture input, and wherein the hand-pointing vector is used to determine that the user input is directed to the 3D object; providing the digital file and the user input as inputs to an LLM, wherein the LLM is tasked with correlating the user input with the tagged spatial data of the digital file, and wherein the LLM is further tasked with generating a response to the user input; and while the LLM's response is being provided to the user, toggling display of a visual cue that overlays at least a portion of the 3D object.

In some aspects, the techniques described herein relate to a computer system for toggling a visibility of tagged spatial data and for correlating the tagged spatial data with output of a large language model (LLM), said computer system including: a processor system; and a storage system including instructions that are executable by the processor system to cause the computer system to: access scene data describing a real-world scene in which a three-dimensional (3D) object is located, wherein the scene data is tagged with spatial data describing at least the 3D object; receive, in real time and from a user, user input directed to the 3D object located in the real-world scene, wherein the user input includes a query related to the 3D object; provide the scene data and the user input as inputs to an LLM, wherein the LLM is tasked with correlating the user input with the tagged spatial data, and wherein the LLM is further tasked with generating a response to the user input; and while the LLM's response is being provided to the user, toggle display of a visual cue that overlays at least a portion of the 3D object.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which:

FIGS. 9A and 9B illustrate another example scenario of output provided by the disclosed service and of a transcript of a conversation, respectively.

DETAILED DESCRIPTION

Figure 1:
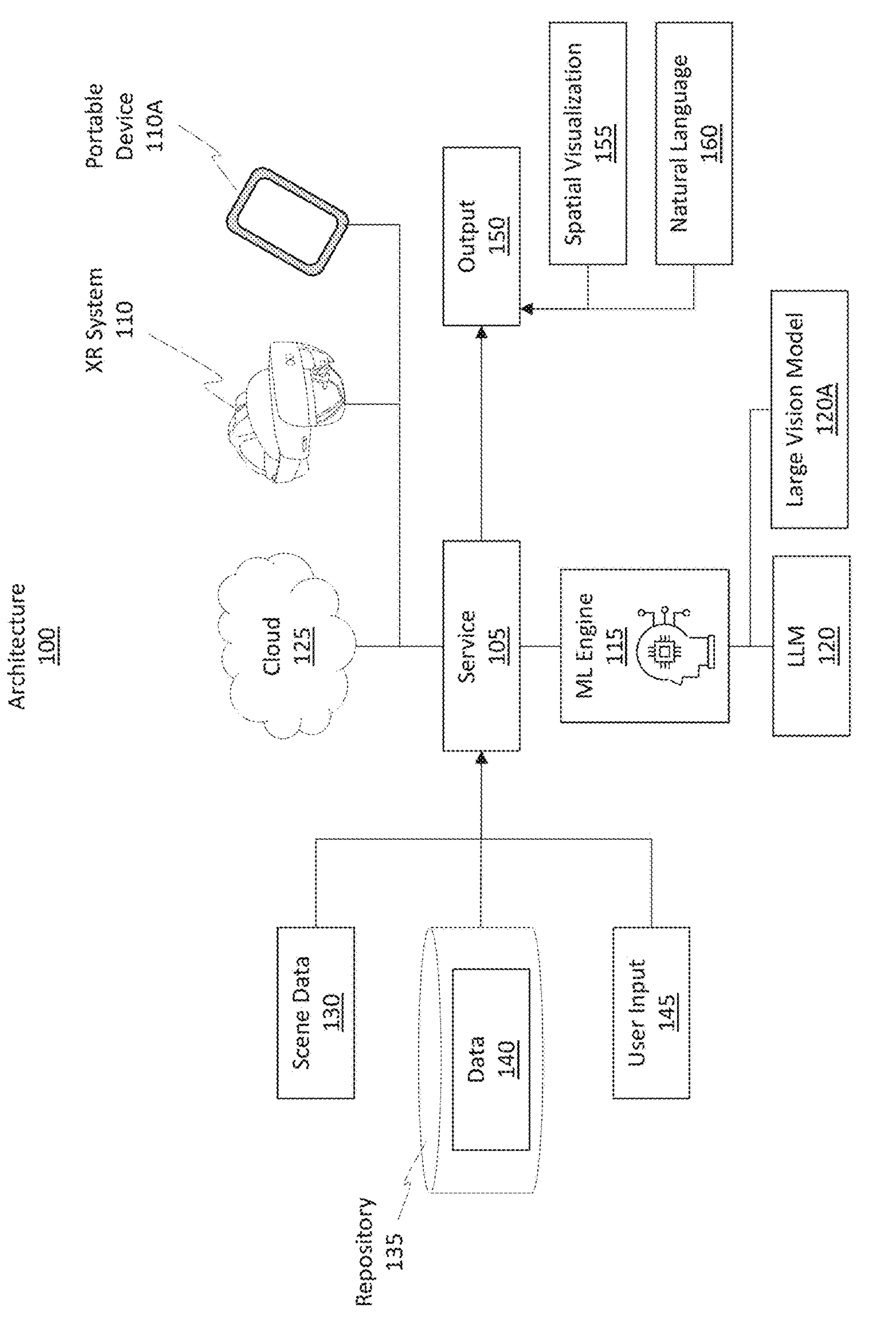
FIG. 1 illustrates an example architecture for toggling the visibility of holograms based on spatial context provided to a large language model (LLM).

The disclosed embodiments are configured to provide contextual data to a large language model (LLM) and to generate holograms based on that contextual data. In some scenarios, the contextual data includes scene data generated by an HMD. In some scenarios, the contextual data is obtained from a 3D image file. Holograms can be generated based on this contextual data. The LLM operates on this contextual data to provide a meaningful response to a user's query. In some instances, the LLM provides a response even without the user providing a query; rather, the LLM is able to monitor the operations of the user and respond based on triggering events or conditions. By practicing the disclosed principles, the capability of an LLM is enhanced because the LLM can now be supplemented with a spatial awareness of a real-world environment. It should be noted how, although a majority of the examples recited herein relate to the use of an HMD, any type of display endpoint can be used. Examples of display endpoints include HMDs, handheld or portable devices, wearable devices, laptops, desktops, or any other type of computing device. Accordingly, it should be appreciated how any type of computing device can be used as the display endpoint.

The disclosed embodiments bring about numerous benefits, advantages, and practical applications to the technical field of XR technology. Beneficially, the embodiments are directed to a workflow for frontline users to interact with artificial intelligence (AI). Users can speak their questions in natural language, and the LLM is able to match phrases with a customer-provided pool of work instruction documents (optionally in the cloud). Advantageously, the LLM becomes spatial by highlighting these 3D parts and relevant information that was also uploaded to the cloud and is now visually anchored to the world. Any type of mobile device can be used, including wearable devices and handheld devices. The disclosed principles enable these devices with specialized spatial capabilities.

As some additional benefits, the disclosed embodiments are able to correlate a spatial context (e.g., location, maps, objects) with knowledgeable base information. The embodiments can also highlight real world objects or digital twins. This highlighting can be performed at different levels of resolution, fidelity, and precision. Different colors can also be used, and specific meaning can even be provided to those colors. For instance, a specific part in an overall structure may initially be highlighted using a red hologram. The red represents that the part is currently inaccessible because a number of other parts, which may be colored different colors, need to be removed first in order to gain access to the part of interest. Thus, the coloring can be used to help guide a user in following a procedure. The embodiments are also able to determine a user's intent using gestures, such as pointing, looking, and tapping on a screen.

As another benefit, the embodiments can understand a 3D asset hierarchy for related parts, parent parts, child parts, and so on. In some scenarios, multiple references to an object may be detected. The embodiments can advantageously disambiguate multiple instances of the same object via position, work order information, user progress with respect to a work order, proximity to other objects, or any other supplemental information.

The embodiments can also use a camera on a mobile device or tablet as framing for spatial context. Spatial relationships can also be surfaced from a spatial context (e.g., a distance between objects). Relevant data can be bundled with an asset using spatial coordinates for re-use on any similar object. Wayfinding through a spatial context with audio-visual support (e.g., map, object map, etc.) is also provided by the disclosed embodiments. The embodiments can also operate at various levels of spatial detail, such as an initial location (e.g., factory A), then to an area (e.g., floor B), then to a room (e.g., training room C), then to a machine (e.g., machine D), then to a part scale (e.g., component F).

Context from other sources can be used as well. For instance, additional context can even be obtained from previous support messages or support calls that may have been made between a user and a support individual. That is, transcripts from previous calls or interactions can also be used as context data for the disclosed embodiments, particularly for the LLM.

Regarding the beneficial features of the LLM, the LLM is now beneficially provided with spatial location understanding via provided files and datasets from a user. The LLM can also now operate using 3D files (e.g., computer-aided design, or "CAD," files), which may include assemblies with part names, attached documents, specifications in a database, and so on. A user's hand pointing vector can also be recognized, which can result in the embodiments being provided with 3D input so that the information that is retrieved can be further filtered. A quick example will be helpful to further illustrate the benefits of this disclosure.

Consider a technician's worksite. The embodiments are able to generate and selectively toggle a 3D overlay on every part of that worksite. Each part has a name and may be used in a work procedure or other sequential step process. When a technician points at a particular item, the embodiments can filter the available knowledge and can reply to the spoken query using the object of attention. A spatial overlay (e.g., in the form of a hologram) can also be displayed to supplement the provided response, resulting in the embodiments providing a multi-sensory output. In some scenarios, the embodiments are able to intelligently toggle hologram visibility. More broadly, however, the embodiments are provided with the ability to pour over an unlimited amount of data and to provide users with the targeted information the user needs at the time and place the user needs it. In some instances, that information can include a document, visualization, audio guidance, or any other type of output. In some cases, the output may be a .pdf document, a 3D guide of specific instructions, environmental highlighting, or even a call transcript that applies to a current question at hand. Accordingly, these and numerous other benefits will now be described in more detail throughout the remaining sections of this disclosure.

Example Architectures

Having just described some of the high level benefits, advantages, and practical applications achieved by the disclosed embodiments, attention will now be directed to FIG. 1, which illustrates an example computing architecture 100 that can be used to achieve those benefits.

Architecture 100 includes a service 105, which can be implemented by an XR system 110 comprising an HMD. As used herein, the phrases XR system, HMD, platform, or wearable device can all be used interchangeably and generally refer to a type of system that displays holographic content (i.e. holograms). In some cases, XR system 110 is of a type that allows a user to see various portions of the real world and that also displays virtualized content in the form of holograms. That ability means XR system 110 is able to provide so-called "passthrough images" to the user. It is typically the case that architecture 100 is implemented on an MR or AR system, though it can also be implemented in a VR system. It should be noted how any type of portable device 110A can also be used.

As used herein, the term "service" refers to an automated program that is tasked with performing different actions based on input. In some cases, service 105 can be a deterministic service that operates fully given a set of inputs and without a randomization factor. In other cases, service 105 can be or can include a machine learning (ML) or artificial intelligence engine, such as ML engine 115. The ML engine 115 enables the service to operate even when faced with a randomization factor.

As used herein, reference to any type of machine learning or artificial intelligence may include any type of machine learning algorithm or device, convolutional neural network (s), multilayer neural network(s), recursive neural network (s), deep neural network(s), decision tree model(s) (e.g., decision trees, random forests, and gradient boosted trees) linear regression model(s), logistic regression model(s), support vector machine(s) ("SVM"), artificial intelligence device(s), or any other type of intelligent computing system. Any amount of training data may be used (and perhaps later refined) to train the machine learning algorithm to dynamically perform the disclosed operations. The disclosed ML engine 115 may include a large language model (LLM) 120 and any type of large vision model 120A. Any type of LLM may be used. Example types include, but are not limited to generative pre-trained transform (GPT) GPT-3 types, GPT-4 types, large language model Meta A (LLaMA) types, and parsing-agnostic language modeling (PaLM2) types.

In some implementations, service 105 is a cloud service operating in a cloud 125 environment. In some implementations, service 105 is a local service operating on a local device, such as the XR system 110. In some implementations, service 105 is a hybrid service that includes a cloud component operating in the cloud 125 and a local component operating on a local device. These two components can communicate with one another.

Figure 2:
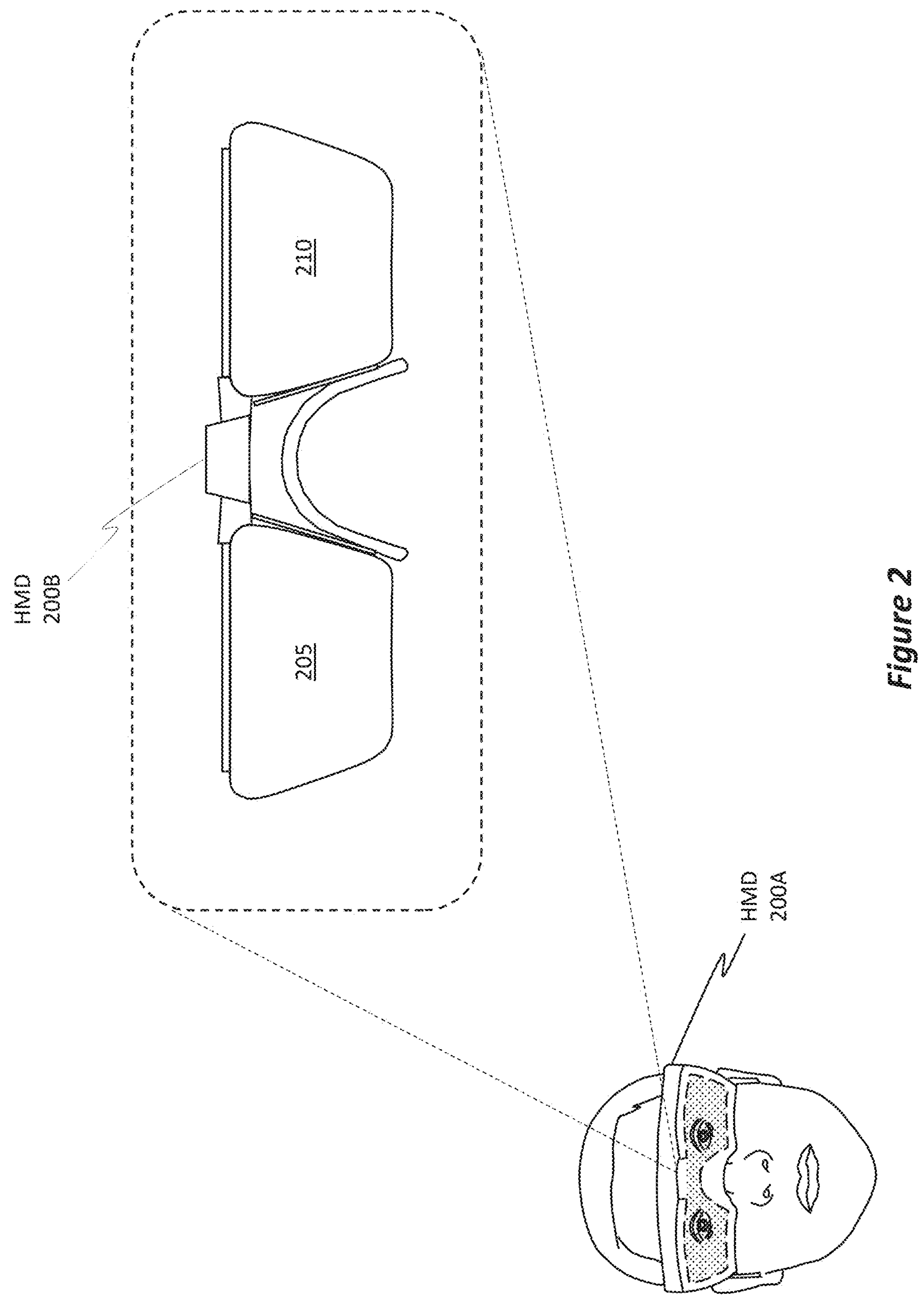
FIG. 2 illustrates an example of an HMD.

Turning briefly to FIG. 2, HMDs 200A and 200B are shown, where these HMDs are representative of the XR system 110 of FIG. 1. HMD 200B includes a left display 205, and a right display 210. HMD 200B is thus configured to provide binocular vision to the user. That is, HMD 200B displays a first image in the left display 205 and a second, different image in the right display 210. The user will view these two separate images, and the user's mind can fuse them, thereby allowing the user to perceive depth with respect to the holograms.

Figure 3:
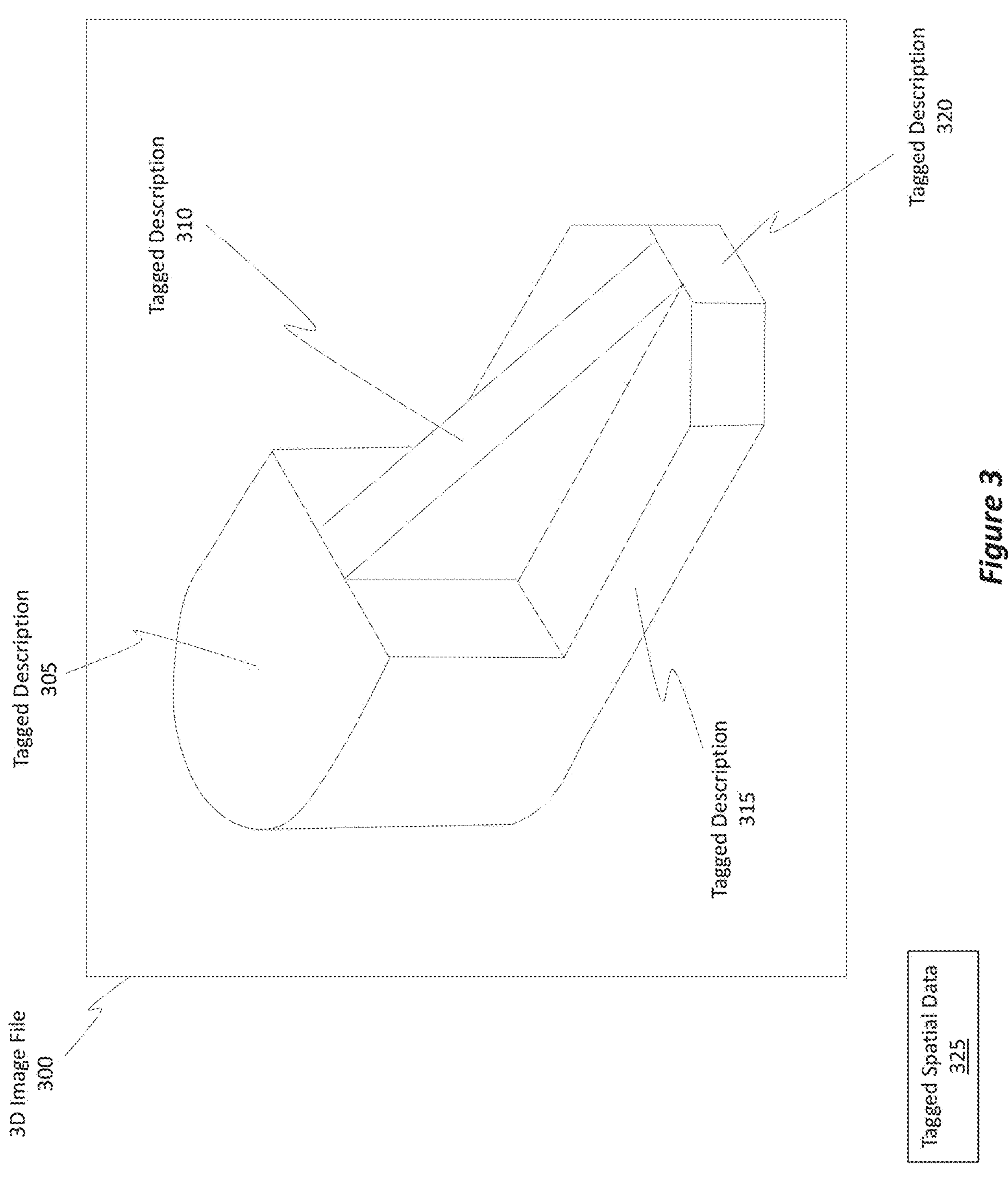
FIG. 3 illustrates an example of a 3D image file (or simply "3D file").

Returning to FIG. 1, service 105 is able to access scene data 130 that describes a scene or environment in which the XR system 110 is operating. This scene data 130 may be previously stored and made accessible to service 105. In some cases, the scene data 130 is generated in real time, such as through the use of the sensors on the XR system 110. The scene data 130 may include object recognition data identifying specific objects in the environment. Service 105 further acquires information from a repository 135, such as data 140. The data 140 may include any type of 3D image data, work documents, pdfs, transcript data, previous notes, curated data, business or domain data, assigned work orders, transcripts of past calls, information pulled from a field service scheduler, and so on. The data 140 can also include large vision models, such that large vision models are provided as input to the service 105. For example, the embodiments can leverage vision to tag images and documents that are not otherwise tagged for input to the service 105. Service 105 can also search and find relevant information that may not necessarily be curated. FIG. 3 provides some additional details.

FIG. 3 shows an example of a 3D image file 300, which generally represents a 3D real-world component. The various parts of the 3D image file 300, or rather of the 3D real-world component, are tagged with data, as shown by tagged descriptions 305, 310, 315, and 320. The tagged descriptions constitute tagged spatial data 325. As used herein, the phrase "tagged spatial data" generally refers to metadata describing various parts or components of a 3D object represented by a 3D image file. For example, the tagged description 310 may include the following phrase: "ramp part of the unit." Thus, the 3D image file 300 may include visual illustrations of a real-world object and may further include granular descriptive information for that object. The 3D image file 30 may include only a simple component made of a single unit or it may include a plethora of constituent parts, such as a 3D image file of an engine block.

Returning to FIG. 1, user input 145 can also be provided to the service 105. This user input 145 may be of any type, including gaze tracking input, gesture input, and audio/auditory input. As an example, the user input 145 may include a user's hand pointing to an object, and the input may further include the following utterance: "what is that?"

Figure 4:
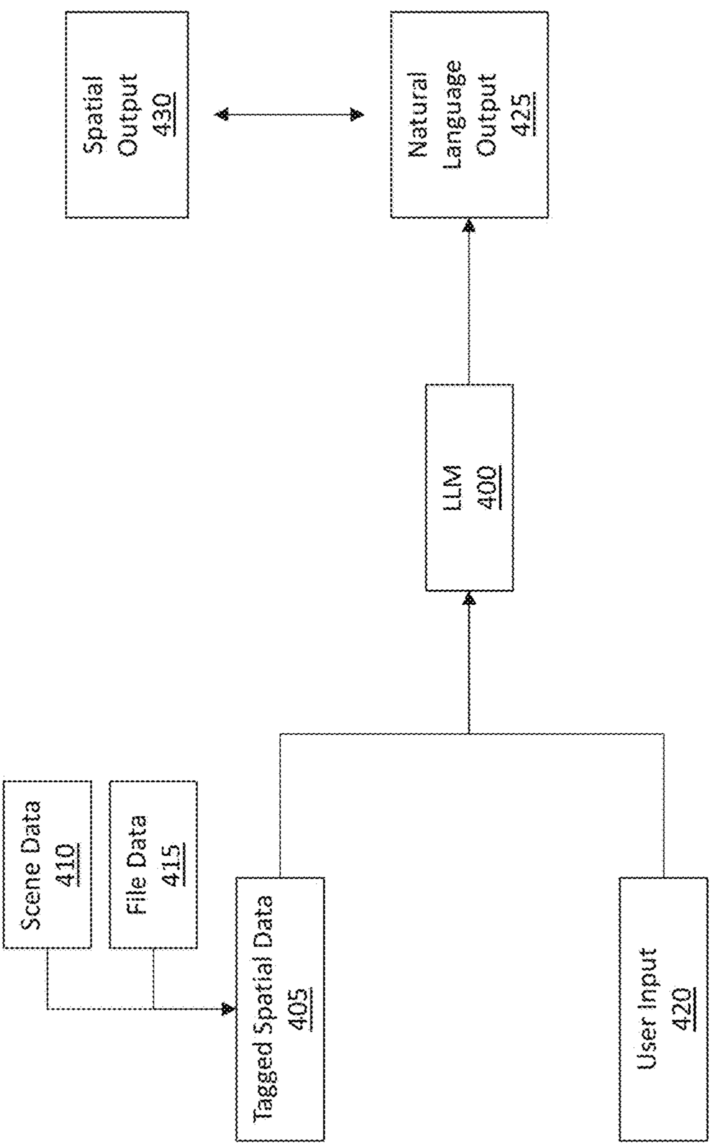
FIG. 4 illustrates how an LLM can be provided tagged spatial data.

Service 105 receives these various data items and then operates using the LLM 120 to generate an output 150. Output 150 may include a spatial visualization 155 and/or natural language 160. FIG. 4 is illustrative.

FIG. 4 shows an LLM 400, which is representative of the LLM 120 from FIG. 1. LLM 400 received tagged spatial data 405, which may include scene data 410 and/or file data 415 (e.g., the 3D image data from FIG. 3). That is, the source or origination for the tagged spatial data 405 can come from a scene itself and/or can come from a file, such as a 3D file.

The tagged spatial data 405 includes metadata descriptions of specific objects included in an environment. LLM 400 also receives user input 420. LLM 400 analyzes the user input 420 and attempts to identify correlations between the user input 420 and the tagged spatial data 405.

As a quick example, suppose the tagged spatial data 405 corresponds to a specific part a technician is working on, and the tagged spatial data 405 includes a 3D file for that part. The user input 420 may include a question raised by the technician regarding a particular feature of the part. The LLM 400 is able to correlate the user's speech with the specific part, as identified by the LLM 400 analyzing the tagged spatial data 405. The file data 415 can even include transcripts of previous conversations between users, such as a client and a support technician, for that specific part. Thus, in some scenarios, input from specific enterprises (e.g., transcript data) can be used and can help focus the scope of the LLM. Thus, some contextual data provided to the LLM can be domain specific curated data.

The LLM 400 will then generate natural language output 425 and provide that output to the user. Additionally, spatial output 430 can also be provided. An example of this spatial output 430 can be a hologram that is displayed in the scene. For instance, if the user asked the LLM 400 what a specific feature of a part was, the natural language output 425 may include a description of that specific feature, and the spatial output 430 may be a hologram that visually highlights the specific part in the scene.

Returning to FIG. 1, by performing the disclosed operations, service 105 gains an understanding of the underlying business fabric layer, and service 105 can assist in various different timing operations or even project management operations. For instance, because service 105 is able to track the progress of a user in performing various different actions, service 105 can generate data that may help update various project management and scheduling applications.

As one example, suppose service 105 is used in a context of a technician calibrating a number of sensors. Service 105 will track the technician's progress. If the technician was only able to complete 5 out of 7 calibrations, service 105 can identify that deficiency and can help update a work schedule to reflect the delay.

Service 105 can also be used to identify specific stations, machines, or other entities that are operating on a scheduled flow. For instance, a user can show up to a factory and query the service, asking the service to identify which machines or which technicians are currently late. Those machines and/or technicians can then be highlighted or otherwise flagged using a hologram. Details regarding how far behind schedule (or how ahead of schedule) can also be used. In this manner, the disclosed embodiments can provide users with so-called "smart" environments.

It should also be noted that although a majority of the examples recited herein relate to the use of an HMD, other device types can be used as well. For instance, any type of mobile or portable device can be used, and touch input can be received and processed. Thus, the disclosed principles should not be viewed as being limited to an HMD; rather, the disclosed principles are device-agnostic.

Having just described some of the principles at a high level, further examples will be helpful. FIGS. 5 through 13 illustrate various example scenarios and implementations of the disclosed embodiments. It will be appreciated that these illustrations are being provided for example purposes only, and the disclosed principles are not limited solely to these types of examples.

Example Scenarios

Figure 5:
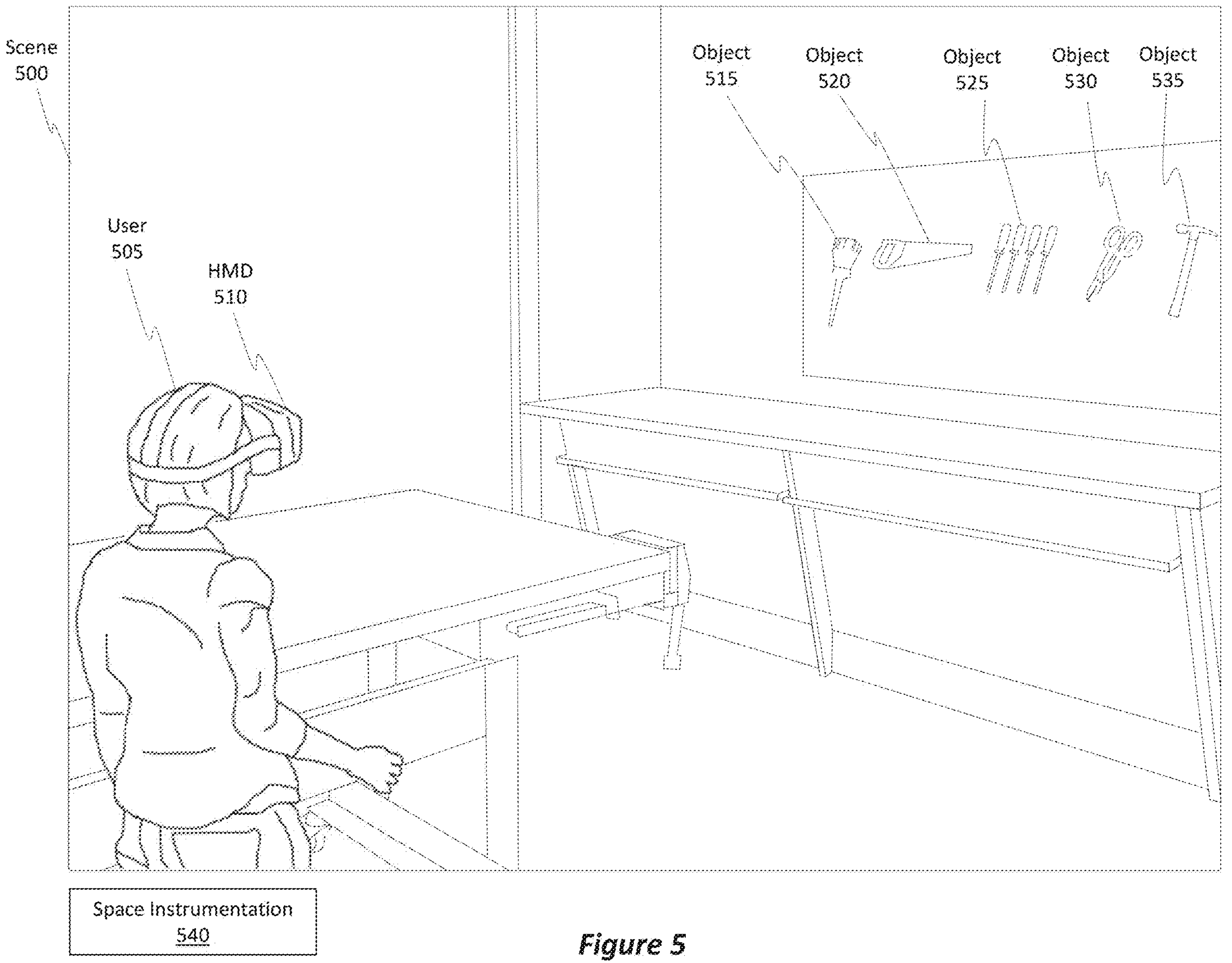
FIG. 5 illustrates an example scenario in which an HMD is obtaining scene data.

FIG. 5 shows an example scene 500 in which a user 505 is wearing an HMD 510. HMD 510 is representative of the XR system 110 and can implement the service 105. In this scenario, HMD 510 is being used to scan the scene to detect the objects therein. For instance, HMD 510 is able to scan and recognize the objects 515, 520, 525, 530, and 535. In this sense, HMD 510 is able to instrument or recognize the space or scene, as characterized by space instrumentation 540. This space instrumentation 540 may be included in the scene data 410 from FIG. 4.

Figure 6:
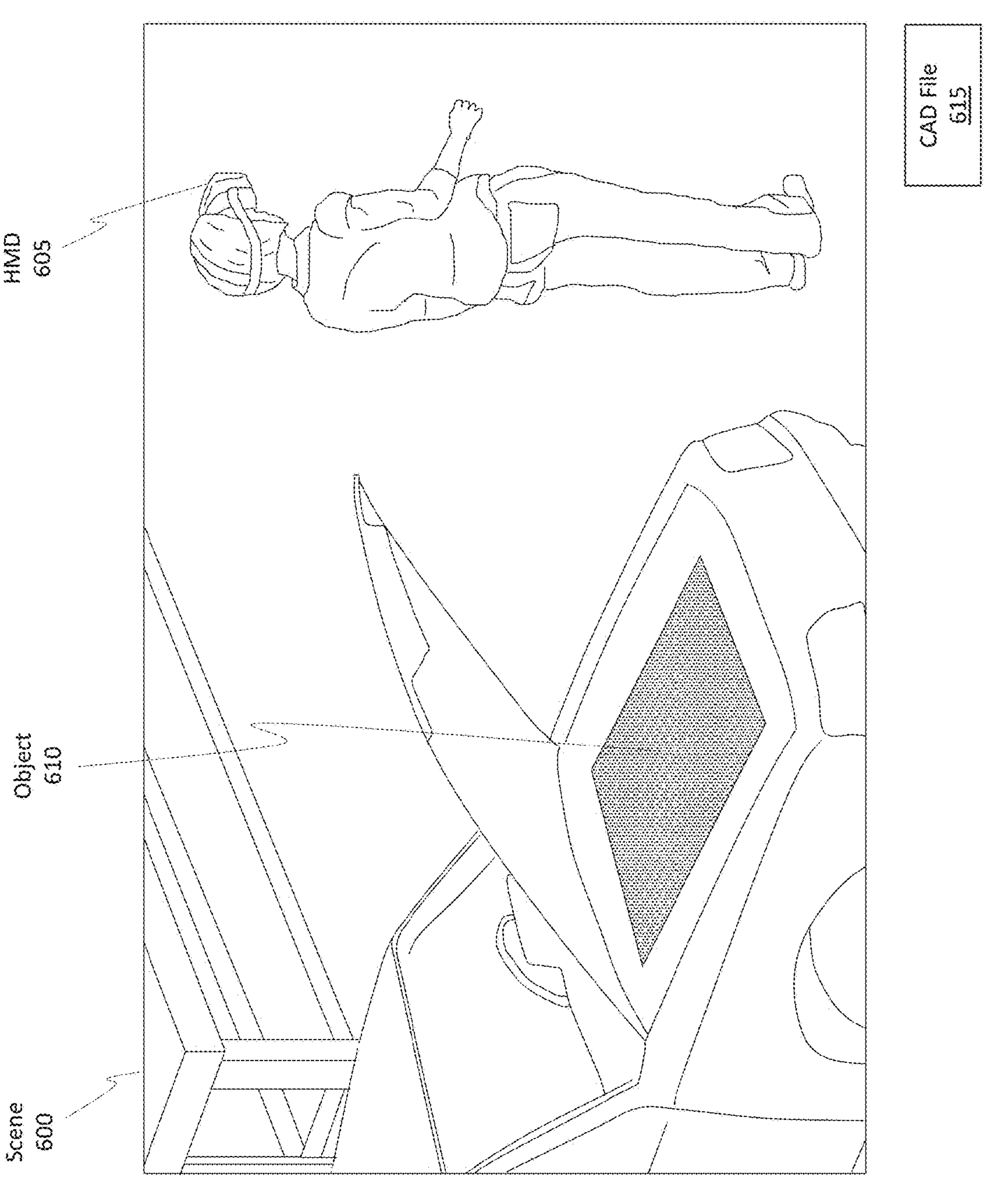
FIG. 6 illustrates an example scenario in which a scene includes an object that has an associated 3D image file.

FIG. 6 illustrates a different perspective view of the scene 500 from FIG. 5, as now labeled by scene 600. Here again is the HMD 605. In this perspective, an object 610 is shown, and that object 610 corresponds to an engine of a car. With reference to FIG. 5, the object 610 is behind the user, who (in FIG. 6) is still looking at the wall of tools in FIG. 5.

Based on the scan of the scene, the embodiments are able to determine whether a 3D file, such as a CAD file 615, exists for the identified object 610. For instance, as mentioned in connection with FIG. 1, service 105 is able to access a repository 135 of data 140, some of which may include 3D files. Data 140 may include other file types as well, such as workflow documents, user manuals, procedure documents, and so on, without limit. In the example of FIG. 6, HMD 605 recognized and identified the object 610 and then accessed the CAD file 615 that corresponded to that object 610. Thus, in some scenarios, the scene data can be used as a filtering parameter to search for and identify additional contextual data, such as CAD files, work procedures, and so on.

Figure 7:
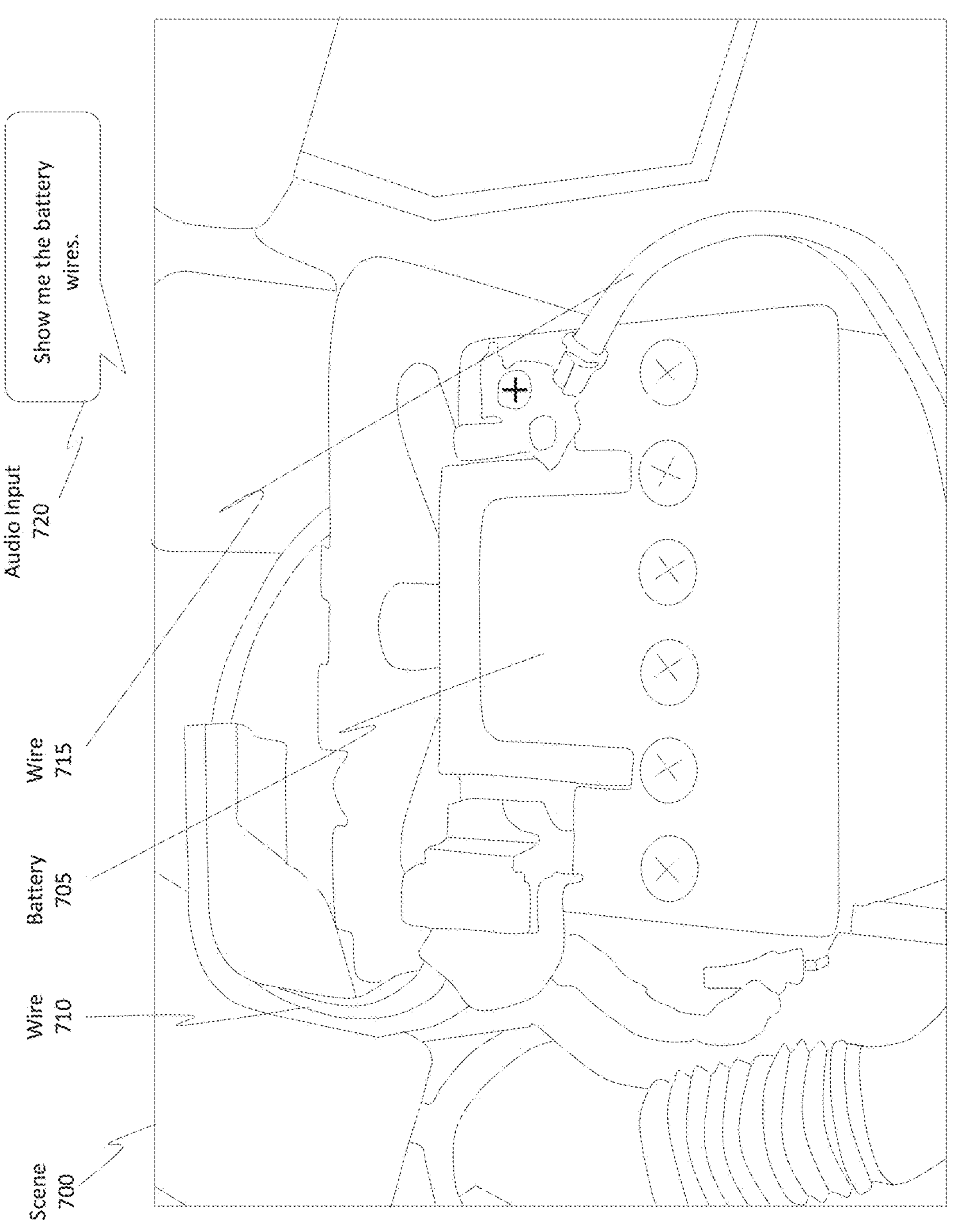
FIG. 7 illustrates an example in which the user is providing input to an LLM.

FIG. 7 shows an example scene 700 in which the user is now looking at the engine of the car (e.g., the engine being object 610 of FIG. 6). In particular, the user is looking at the battery 705 and the wires 710 and 715.

The user is now providing input to the service 105. This particular input is an audio input 720. Notably, the user is speaking the following phrase: "show me the battery wires."

In accordance with the disclosed principles, service 105 is able to receive this audio input 720, parse it, and then feed it as input to the LLM 120. Additionally, service 105 is able to feed the LLM 120 the CAD file for the engine of the car, or rather, feed the LLM 120 the tagged spatial data for the car's engine (that tagged spatial data came from the CAD file). Recall, the CAD file includes tagged spatial data identifying the various parts or portions of the object reflected by that CAD file (e.g., the engine of the car). In some scenarios, the LLM 120 operates using the text from the tagged spatial data. In some scenarios, the LLM 120 may additionally operate on image data, such as the CAD image itself.

LLM 120 is then tasked with analyzing the user's input and attempting to provide a response. In this scenario, the response will also rely on the tagged spatial data included in the CAD file because the user is referring to the battery wires. Thus, the LLM 120 identifies correlations between the tagged spatial data and the user's input. LLM 120 then generates an output, as shown by FIG. 8.

Figure 8:
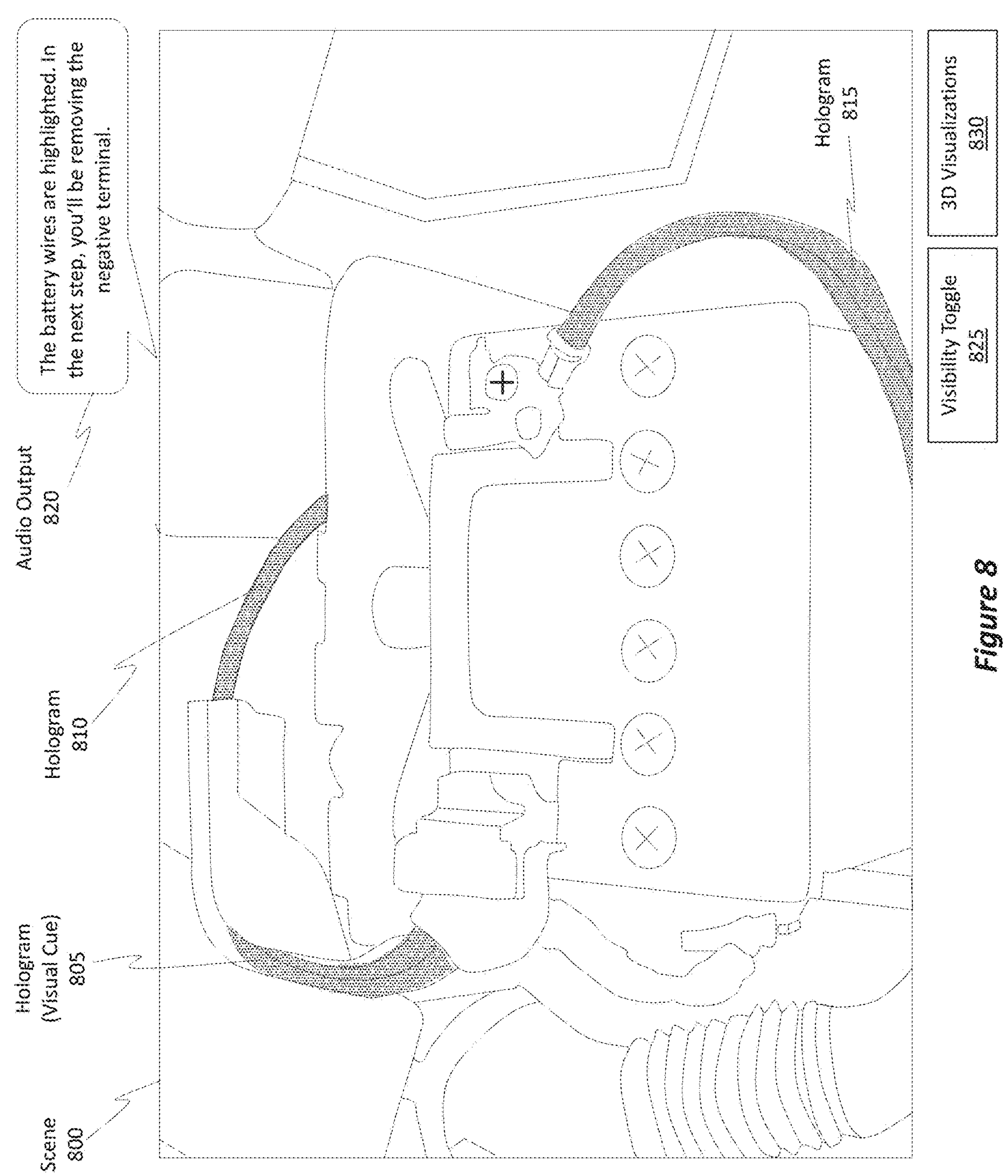
FIG. 8 illustrates an output provided by the disclosed service, where this output includes natural language output provided by an LLM and a spatial output in the form of a hologram.

FIG. 8 shows an example scene 800, which now includes a number of holograms, or visual cues, as shown by holograms 805, 810, and 815. These holograms are overlaid on the battery's wires to show the user those wires, per the user's request. Additionally, an audio output 820 in the form of natural language is provided. This audio output 820 includes the following phrase, which is played over a speaker of the HMD, "the battery wires are highlighted." "In the next step, you'll be removing the negative terminal."

In this example scenario, the user is following a work procedure, which requires the removal of the battery. Service 105 has been provided documentation that details the work procedure; this documentation may be included as a part of the data 140 from FIG. 1.

Service 105 has also been provided various other files, including a 3D file (e.g., a CAD file) of the engine that includes the battery. Service 105 is guiding the user in following the work procedure and is able to respond to the user's queries using the LLM. Furthermore, service 105 is able to toggle the visibility (e.g., as shown by visibility toggle 825) of various 3D visualizations 830 in the form of the holograms/visual cues. Service 105 is able to accomplish these objectives via the use of the LLM, which is tasked with analyzing the user's input and with correlating that input with data obtained from the scene and data obtained from other sources, such as a CAD file.

Notice, in FIG. 8, the LLM's response also calls out a specific procedure step that will be followed. Further notice the timing element in the LLM's response. Specifically, the LLM has informed the user that the user will subsequently be removing the negative terminal "in the next step." Thus, the LLM is able to track the progress of the user while the user is performing the work procedure. In other words, the service is able to maintain a timing understanding of the user's progress.

Regarding the visibility toggle 825, it should be noted how the embodiments are able to automatically generate holograms based on the descriptions provided in the 3D file. The embodiments can toggle the display of these holograms based on the user's input and based on other parameters, such as the user's progress through a work order. Thus, in contrast to scenarios that require the manual generation of a hologram, the embodiments are able to automatically generate holograms using the information included in the 3D file.

Furthermore, the embodiments are able to capitalize on the tagged spatial data that is included in the 3D file by providing that data to the LLM. The LLM can then operate using the tagged spatial data as well as the user's input (or any other input) to generate an output. The final resulting output may be a combination of the LLM's natural language output along with a spatial output in the form of a hologram. Other output types can also be provided, such as a haptic output.

The hologram is thus associated with the LLM's natural language output. For instance, the holograms 805, 810, and 815 all constitute spatial output and are linked or associated with the natural language audio output 820 provided by the LLM. Thus, the service 105 can create the spatial output and the LLM 120 can create the natural language output. These outputs can be provided to the user concurrently with one another, resulting in a scenario where a multi-sensory output (e.g., audio response, visual response, haptic response) is provided to the user.

Figure 9A:
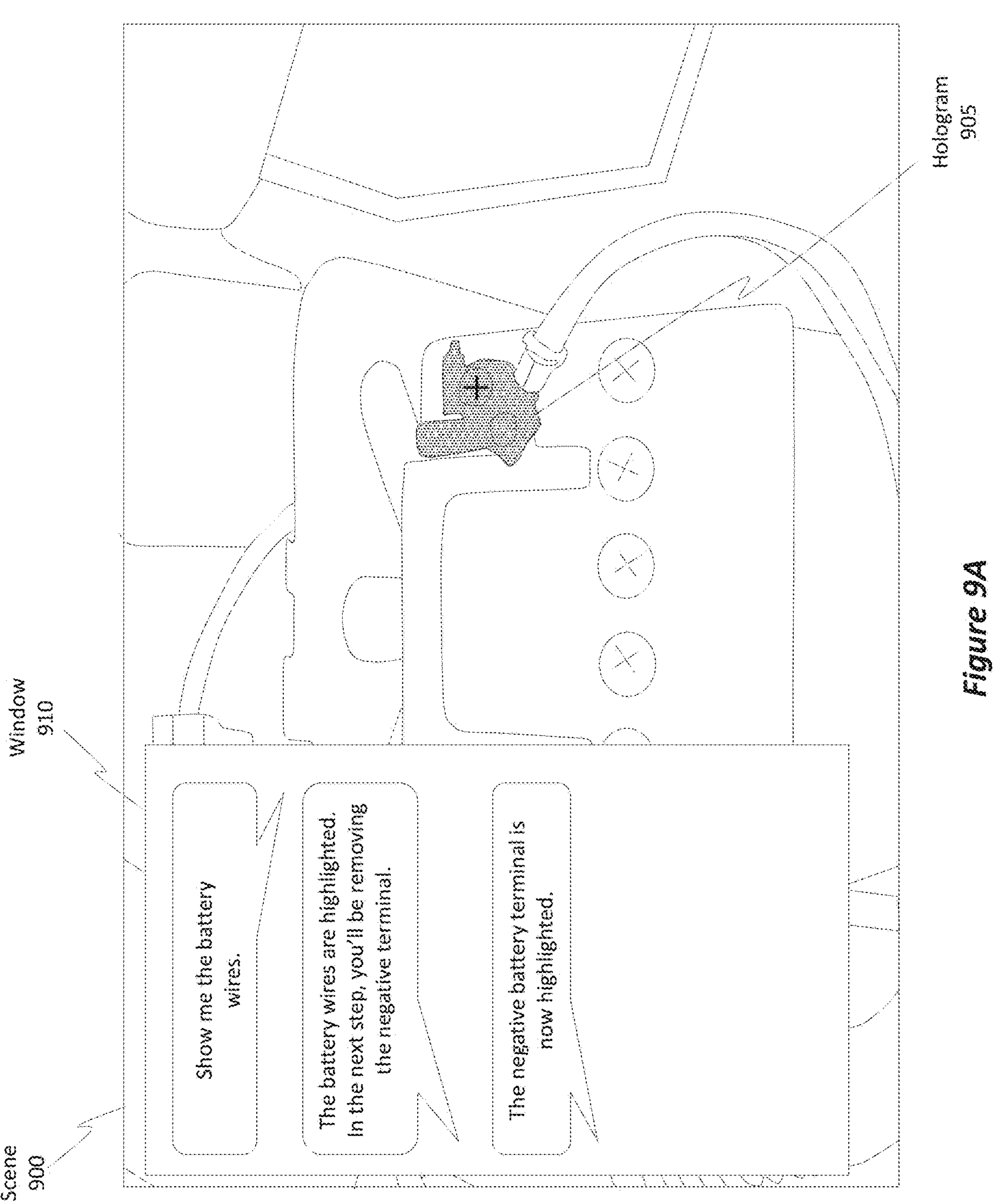

FIG. 9A shows an example scene 900 in which a hologram 905 is now used to emphasize or identify the negative battery terminal. In this scenario, a window 910 is also displayed and is showing the conversation between the user and the service 105. Thus, the inputs and outputs can be displayed in a logged record for the user to consult. Additional information can also be displayed, such as images and videos. For instance, the window 910 can include excerpts from a work order, example images of the work to be performed, or even instructional videos that the user can follow. The window 910 can also display an illustration from the 3D file the service accessed.

FIG. 9B illustrates a conversation 915 between a technician (e.g., "John") and the disclosed service 105 (e.g., "Copilot"). In response to a question from the technician, service 105 is able to consult various different types of information, including a transcript 920 from a previous call that dealt with a similar issue. Service 105 is able to display the transcript to the technician and analyze the transcript 920 in an attempt to resolve the current issue. A back-and-forth conversation can be had, as shown by the boxes and the ellipsis 925 in FIG. 9B. This conversation can beneficially be annotated with documents, spatial data, or any other type of information.

Figure 10:
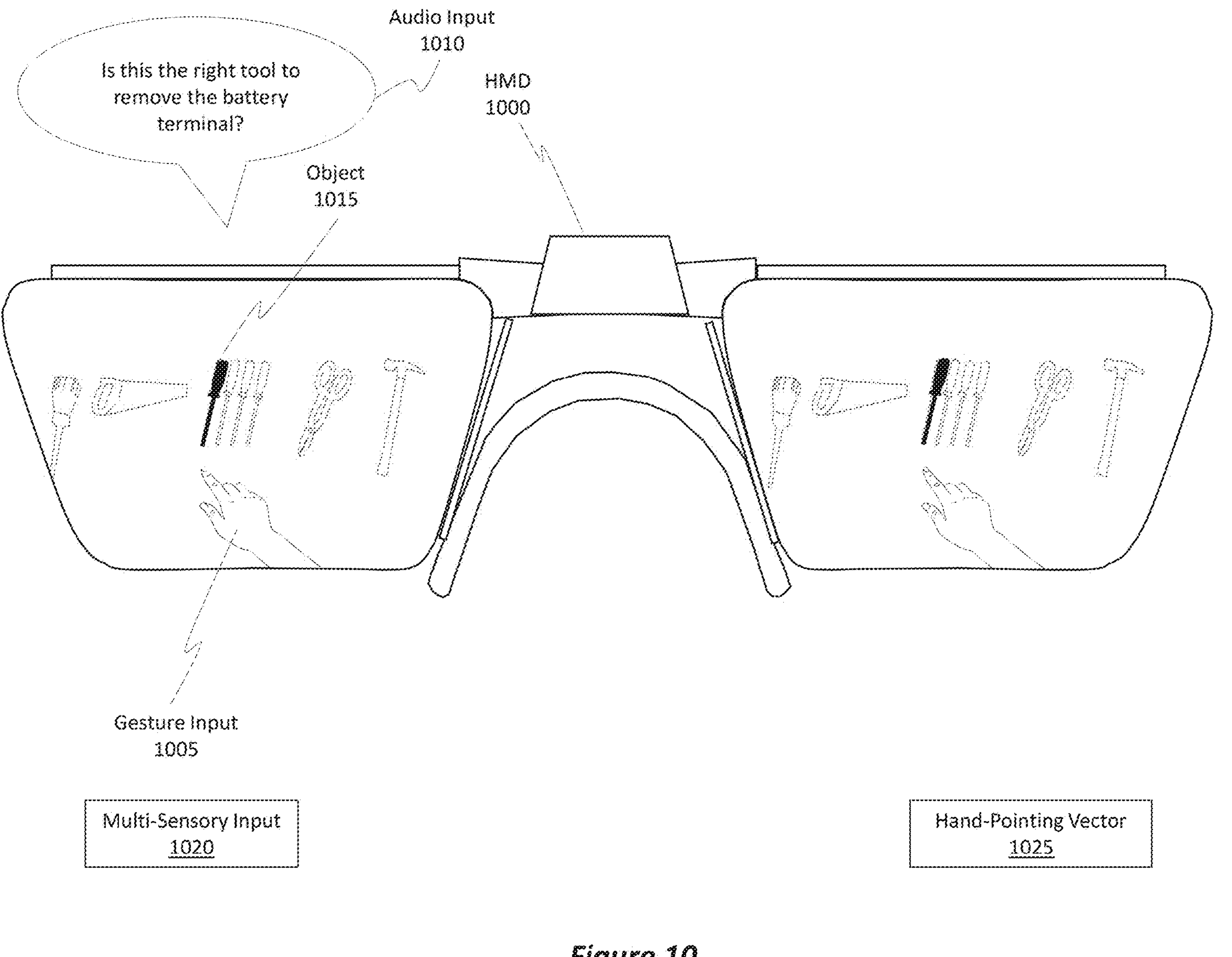
FIG. 10 illustrates various different visualizations of queries and output.

FIG. 10 shows a scenario involving the HMD 1000, which is representative of the HMDs discussed thus far. In this scenario, the user has turned again and is now looking back at the wall of tools. In this scenario, the user is providing a combination of a gesture input 1005 and an audio input 1010 directed to a specific object 1015, which is highlighted black in the displays of the HMD 1000. As a result, a multi-sensor input 1020 is being provided to the service.

The service is able to use the gesture input 1005 to generate a hand-pointing vector 1025 to help identify which object the user is referring to. Similarly, the service can use the LLM to analyze the audio input 1020, which may optionally be converted to text. In this example scenario, the user is pointing to the left-most screwdriver and is uttering the following phrase: "Is this the right tool to remove the battery terminal?"

Figure 11:
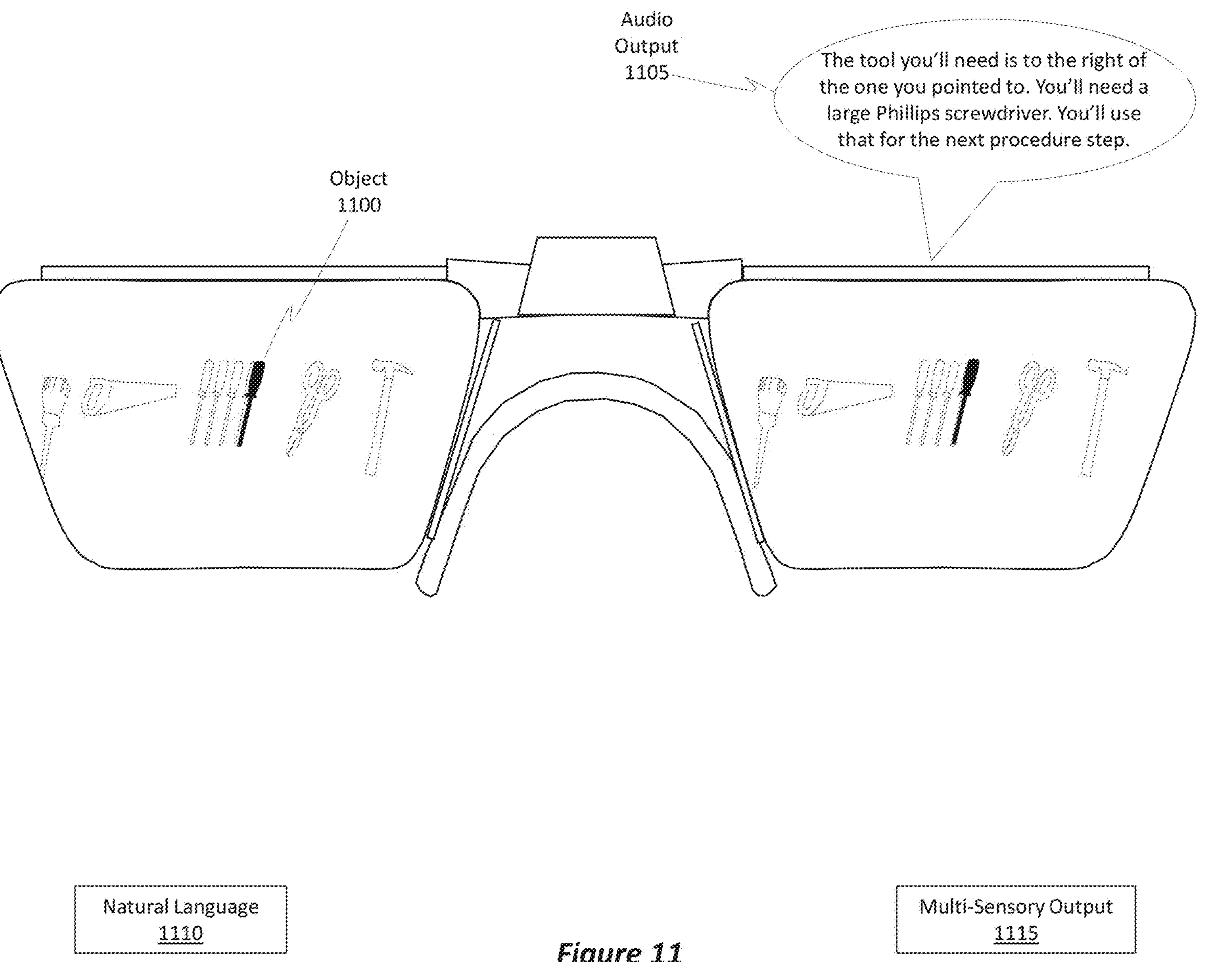
FIG. 11 illustrates various different visualizations of output.

FIG. 11 shows the response provided by the service. In particular, the service is responding by highlighting the rightmost screwdriver, as shown by the highlighted object 1100. Service is also providing the following audio output 1105: "The tool you'll need is to the right of the one you pointed to." "You'll need a large Phillips screwdriver." "You'll use that for the next procedure step." Notice, the audio output 1105 is in the form of natural language 1110. The combination of the visual cue (e.g., highlighting provided by the hologram covering object 1100) and the audio output constitute a multi-sensory output 1115.

FIG. 11 demonstrates a number of notable benefits provided by the disclosed embodiments. First, the embodiments are able to obtain scene data and use that scene data to provide an appropriate response to the user's queries. In this scenario, the user was pointing to a screwdriver, but the size of the screwdriver and/or the type was not appropriate to remove the battery terminal. The embodiments were able to acquire scene data to not only identify the correctly sized screwdriver but also identify the correct type. That is, although multiple different screwdrivers were included in the scene, the embodiments were able to analyze the differences between those screwdrivers (via the scene data) and identify a specific one that would be suitable for the task being performed by the user. The embodiments also guided the user to select the right one. This guidance came in the form of a hologram overlaying the tool as well as positional language (e.g., "to the right of the one you pointed to").

The embodiments are also tracking the user's progress in performing the various work steps. In particular, the service was provided a workflow procedure, and the service was able to analyze that (e.g., using the LLM) to determine the individual steps that would need to be performed. Additionally, the service was able to determine and locate which specific tools would be required to accomplish the steps of the workflow. The service was able to guide the user in identifying the appropriate tool and was able to guide the user in following the steps of the procedure.

Figure 12:
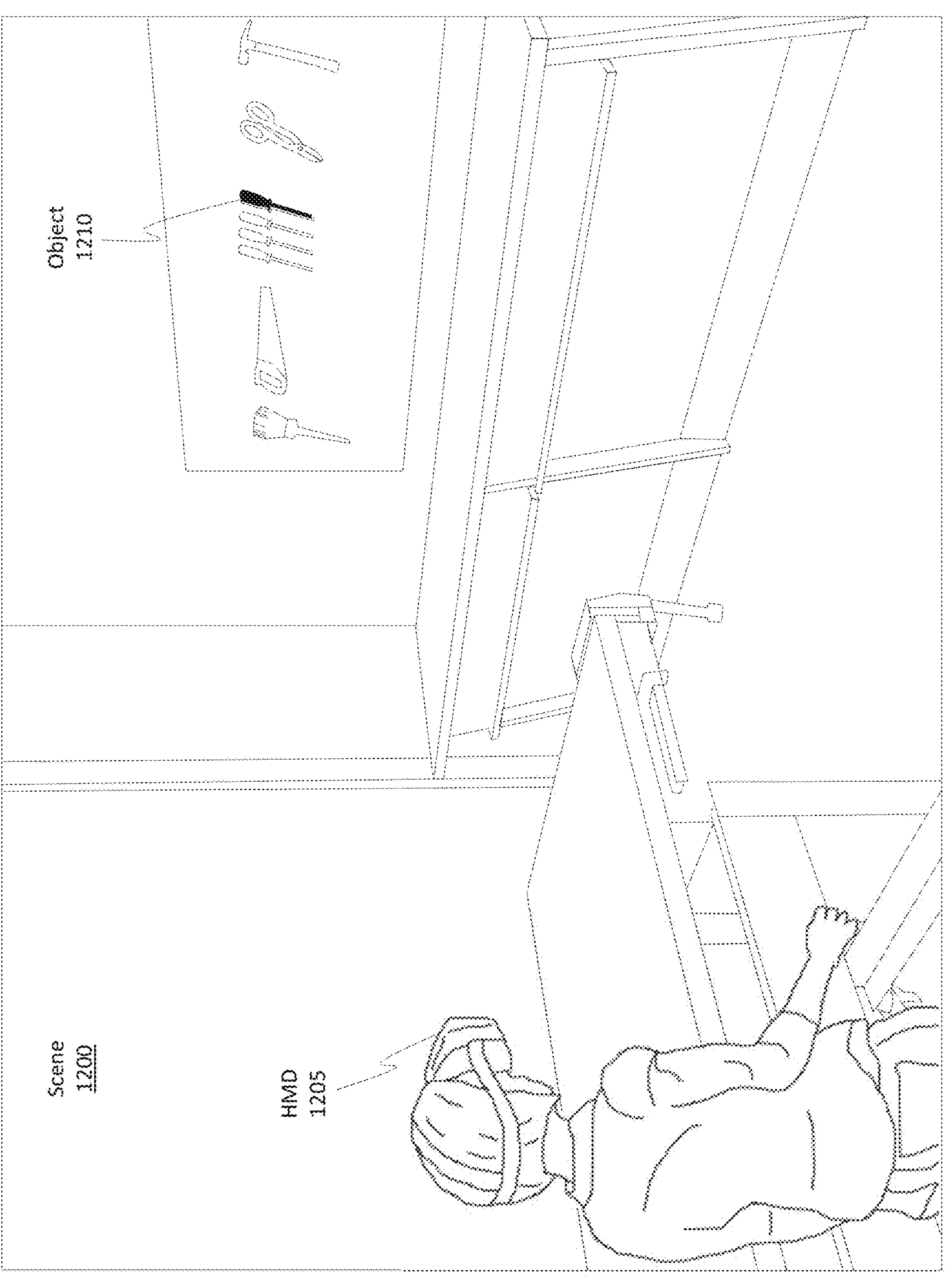
FIG. 12 illustrates another perspective view of a hologram.

FIG. 12 illustrates another perspective view of the scenario shown in FIG. 11. In particular, FIG. 12 now shows a scene 1200 in which the HMD 1205 is displaying a hologram for the object 1210 that is to be used for the next procedure step.

Figure 13:
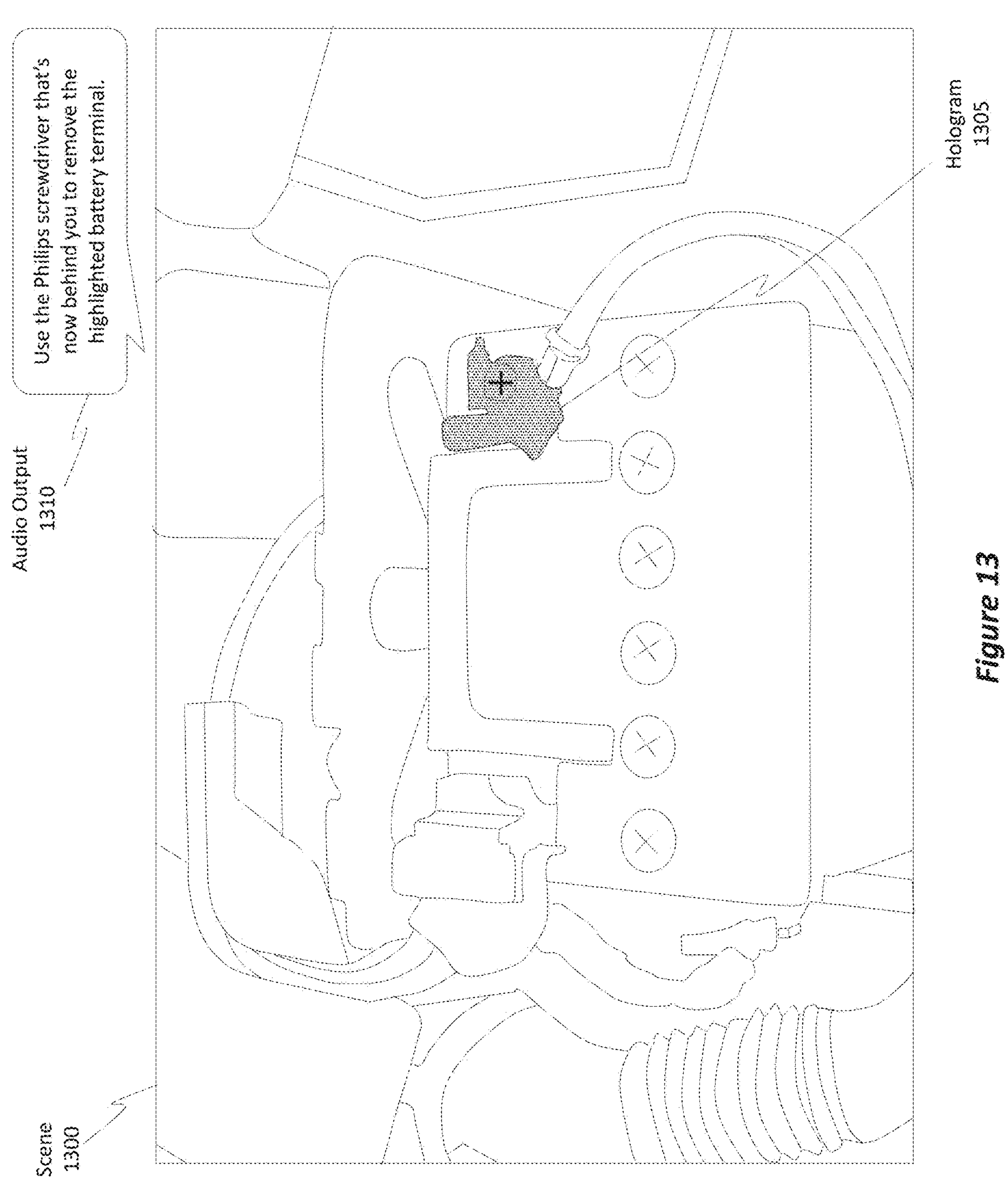
FIG. 13 illustrates another view of the use of a multisensory output.

FIG. 13 shows a scenario in which the user is now looking at the battery again, as shown by scene 1300. In scene 1300, the negative battery terminal is now visually emphasized via the hologram 1305 (and the Phillips head bolt is visible).

The service is also providing an audio output 1310, which includes the following language: "Use the Phillips screwdriver that's now behind you to remove the highlighted battery terminal." Notice, from the response of the service, the service has recognized that the user did not acquire the tool. That is, the tool is still handing on the wall behind the user. Thus, the service is able to recognize a positional relationship between the user and a particular object, and that positional relationship can be monitored even as the user moves (e.g., in this scenario, the user turned around without acquiring the tool).

From these various examples, it should be appreciated how the disclosed embodiments are able to utilize tagged spatial data for various objects. This tagged spatial data may be automatically created by an XR system that monitors a scene using its scanning sensors. The tagged spatial data may also be created via the use of imported files, such as 3D files in the form of a CAD file. The embodiments are further able to acquire data from other sources, such as work documents, pdfs, or any other contextual data.

Holograms can then be automatically generated and selectively toggled based on the scene data and based on the user input. The embodiments are further able to feed, as input, data to an LLM. This input may be user input, the tagged spatial data, the work documents, and so on. The LLM is able to analyze this input to identify correlations, particularly based on the user input. The LLM may then generate a natural language output that acts as a response or guide to the user. By performing these various operations, the embodiments significantly improve how a user performs his/her work tasks and further provides a smart environment for the user.

Example Methods

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 14:
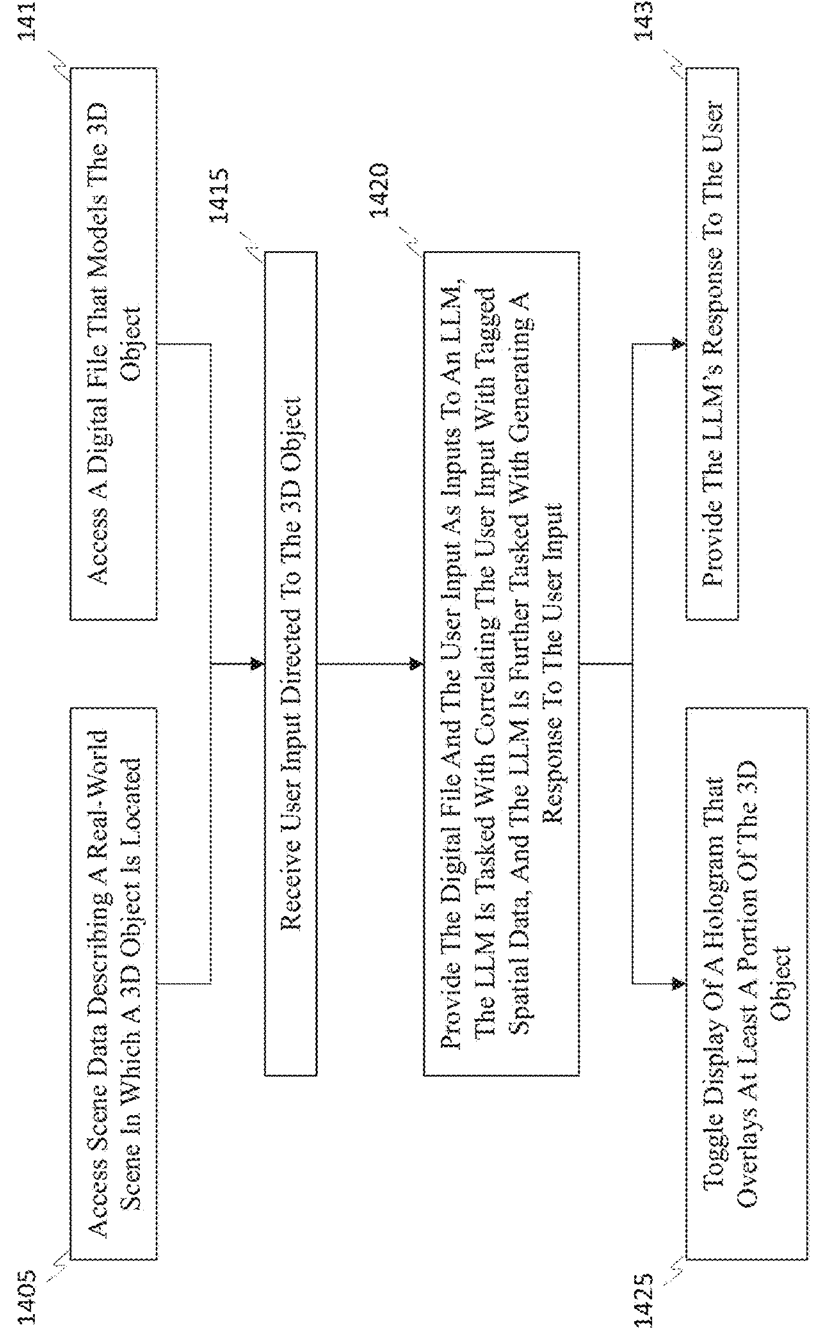
FIG. 14 illustrates a flowchart of an example method for toggling the visibility of holograms based on spatial data provided to an LLM.

Attention will now be directed to FIG. 14, which illustrates a flowchart of an example method 1400 for toggling a visibility of tagged spatial data and for correlating the tagged spatial data with output of a large language model (LLM). Method 1400 may be implemented within the architecture 100 of FIG. 1. Similarly, method 1400 may be performed by the service 105, which may be operating on the XR system 110 and/or in the cloud 125.

Method 1400 includes an act (act 1405) of accessing scene data describing a real-world scene in which a three-dimensional (3D) object is located. This scene data may have been generated at a previous time by the HMD or perhaps even by a different HMD, and the scene data may be stored in the cloud. In some scenarios, the scene data is generated in real time using the HMD's own sensors.

Act 1410 includes accessing a digital file that models the 3D object. In some cases, the digital file is accessed in response to the 3D object being recognized in the scene data. In some cases, the digital file is uploaded by a user because the user knows he/she will be working with that specific 3D object.

The digital file includes tagged spatial data associated with the 3D object. The tagged spatial data can include component descriptions, part types, part names, tools that may be needed to work with the 3D object, replacement parts that can be used, and so on. In some scenarios, the digital file includes a computer-aided design (CAD) file. Optionally, the digital file of the 3D object may include a 3D asset hierarchy associated with the 3D object. For instance, the 3D asset hierarchy may include a parts or components list or a list of associated objects (e.g., tools that may be used to operate on the object).

Act 1415 includes receiving, in real time and from a user, user input directed to the 3D object located in the real-world scene. The user input may be of any type, such as one or any combination of a verbal input, a gesture input, or even an eye gazing input. As a specific example, consider a scenario where the user input includes a gesture input. In such a scenario, a hand-pointing vector may be generated based on the gesture input, and the hand-pointing vector can be used to determine that the user input is directed to the 3D object.

Act 1420 includes providing the digital file and the user input as inputs to an LLM. Other contextual data can also be provided as input to the LLM, such as workflows, scheduling data, and so on.

The LLM is tasked with correlating the user input with the tagged spatial data of the digital file. The LLM is further tasked with generating a response to the user input. The inputs to the LLM may further include a work instruction document, and whatever output the LLM provides may be further based on the work instruction document. The LLM's output/response may include a natural language text output, and the natural language text output may be converted to an audio output and may be played over a speaker to the user who provided the user input.

In some scenarios, the service may also apply weights to the input. For instance, the service can perform an initial analysis on the input data to determine whether one type is more contextually relevant as compared to another type. If that is the case, then service can apply a weight to the input type so LLM may be influenced or guided to consider that input more heavily as compared to the other inputs. As a quick example, if a user's gesture is somewhat ambiguous in that uncertainty exists as to whether the user is pointing to a first object or a second object, but the user speaks a specific key term relating to the first object, then the user's utterances can be provided more weight as compared to the gesture input.

The LLM processes the user input to identify specific tagged spatial data from the digital file. This specific tagged spatial data may be data that is determined by the LLM to correspond to one or more key terms or phrases included in the user input. The LLM can also optionally consult additional curated files that are identified as being associated with the 3D object. As one example, at least one additional curated file may include a particular curated file that includes sequential usage steps (e.g., a work procedure) for the 3D object. As another example, the additional curated files may include a parts directory for the 3D object. Curating information for the real-world scene may be performed based on the scene data, the digital file, and manual input.

The output of the LLM can then be mapped back to the 3D image file or back to a specific component, which has a hologram associated with it. Stated differently, the LLM's output can be mapped back to the spatial world so a hologram can be displayed.

Act 1425 includes toggling display of a hologram (or any type of visual cue) that overlays at least a portion of the 3D object. In some scenarios, the hologram overlays only a specific part or portion of the 3D object as opposed to overlaying an entirety of the 3D object. In other scenarios, the hologram may overlay the entire 3D object.

It should be noted how multiple holograms, including the one for the specific portion of the 3D object, may be automatically generated for the 3D object based on the digital file. The LLM's response may include spatial descriptions associated with the 3D object. Such spatial descriptions may include location information, usage information, or any other type of information.

As a result of providing the LLM's response to the user (act 1430) and as a result of toggling the display of the visual cue, a comprehensive response is provided to the user who provided the user input. The comprehensive response includes a language aspect and a physical space aspect (e.g., a hologram displayed in physical space).

In some cases, the scene data includes data describing a second 3D object included in the real-world scene. The scene data can also be included in the inputs to the LLM. The LLM's response may then include details on how the second 3D object is to be used in association with the original 3D object. Optionally, this usage may be a part of a procedural work process. As a quick example, it may be the case that the second 3D object must first be removed in order to gain unfettered access to the first 3D object. Initially, the first 3D object may be displayed using a red color to symbolize how it is currently inaccessible due to the second 3D object. The second 3D object may initially be displayed using a green color to symbolize how it should be removed first.

Figure 15:
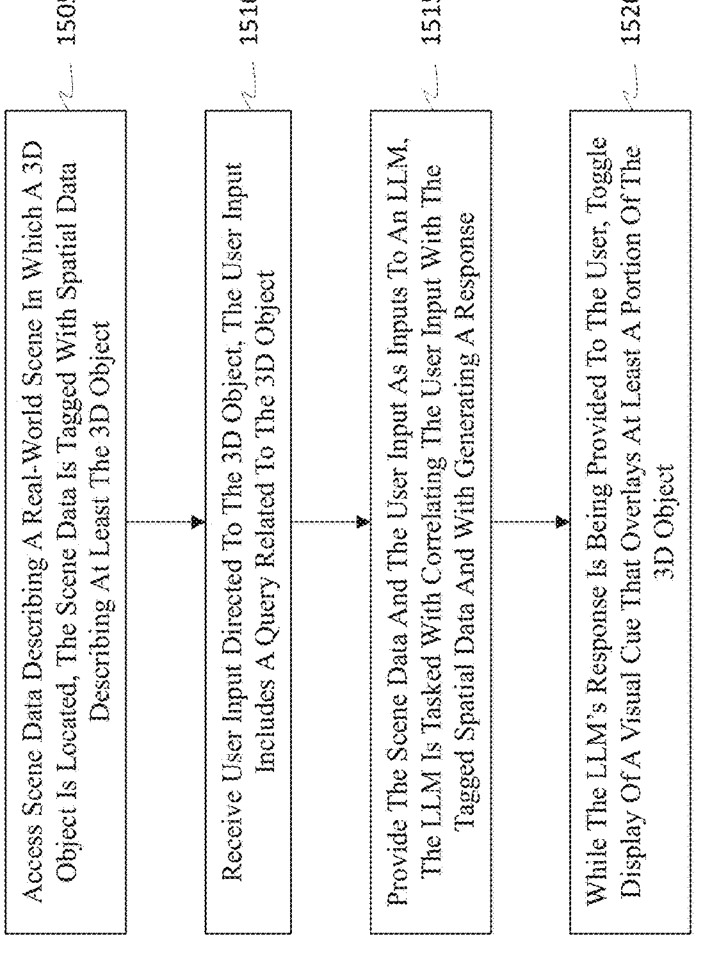
FIG. 15 illustrates another flowchart of an example method for toggling the visibility of holograms based on spatial data provided to an LLM.

FIG. 15 illustrates another flowchart of an example method 1500 for toggling a visibility of tagged spatial data and for correlating the tagged spatial data with output of a large language model (LLM). Method 1500 may also be performed using service 105 of FIG. 1.

Method 1500 includes an act (act 1505) of accessing scene data describing a real-world scene in which a three-dimensional (3D) object is located. The scene data is tagged with spatial data describing at least the 3D object. In some scenarios, the spatial data is generated as a result of performing object recognition. In some scenarios, the spatial data may be generated using an imported 3D file. In some cases, the spatial data is manually entered by a user or is automatically generated by the service 105.

Act 1510 includes receiving, in real time and from a user, user input directed to the 3D object located in the real-world scene. The user input includes a query related to the 3D object.

Act 1515 includes providing the scene data and the user input as inputs to an LLM. The LLM is tasked with correlating the user input with the tagged spatial data and with generating a response to the user input.

While the LLM's response is being provided to the user, act 1520 includes toggling display of a visual cue that overlays at least a portion of the 3D object. The LLM's response often includes natural language that can be displayed to the user or can be played using a speaker.

Example Computer/Computer Systems

Figure 16:
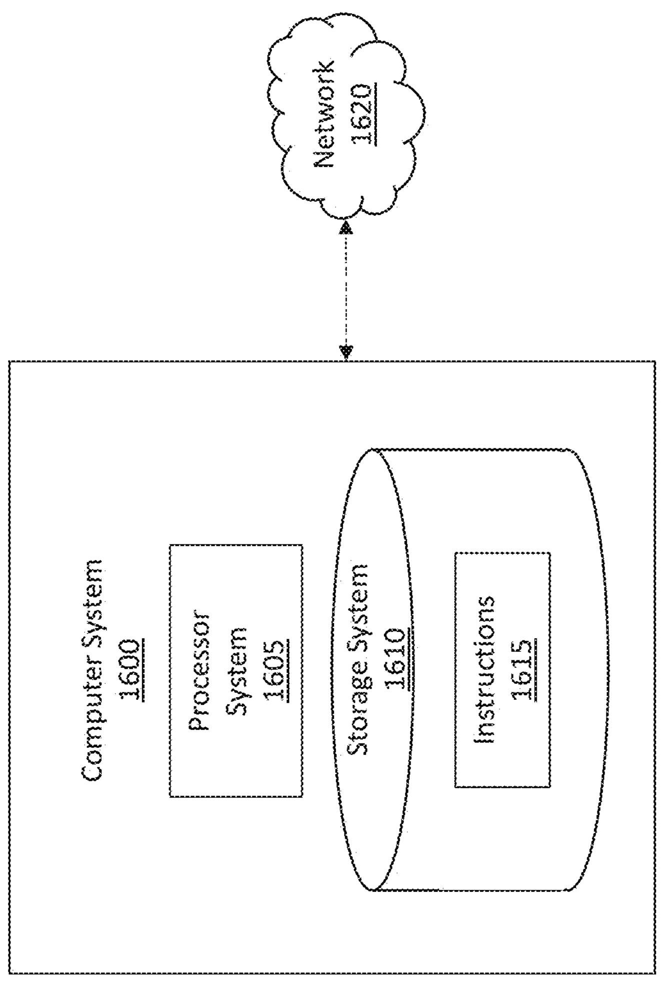
FIG. 16 illustrates an example computer system that can be configured to perform any of the disclosed operations.

Attention will now be directed to FIG. 16 which illustrates an example computer system 1600 that may include and/or be used to perform any of the operations described herein. For instance, computer system 1600 can be in the form of the XR system 110 of FIG. 1 and can implement the service 105.

Computer system 1600 may take various different forms. For example, computer system 1600 may be embodied as a tablet, a desktop, a laptop, a mobile device, or a standalone device, such as those described throughout this disclosure. Computer system 1600 may also be a distributed system that includes one or more connected computing components/devices that are in communication with computer system 1600.

In its most basic configuration, computer system 1600 includes various different components. FIG. 16 shows that computer system 1600 includes a processor system 1605 that includes one or more processor(s) (aka a "hardware processing unit") and a storage system 1610.

Regarding the processor(s), it will be appreciated that the functionality described herein can be performed, at least in part, by one or more hardware logic components (e.g., the processor(s)). For example, and without limitation, illustrative types of hardware logic components/processors that can be used include Field-Programmable Gate Arrays ("FPGA"), Program-Specific or Application-Specific Integrated Circuits ("ASIC"), Program-Specific Standard Products ("ASSP"), System-On-A-Chip Systems ("SOC"), Complex Programmable Logic Devices ("CPLD"), Central Processing Units ("CPU"), Graphical Processing Units ("GPU"), or any other type of programmable hardware.

As used herein, the terms "executable module," "executable component," "component," "module," "service," or "engine" can refer to hardware processing units or to software objects, routines, or methods that may be executed on computer system 1600. The different components, modules, engines, and services described herein may be implemented as objects or processors that execute on computer system 1600 (e.g. as separate threads).

Storage system 1610 may be physical system memory, which may be volatile, non-volatile, or some combination of the two. The term "memory" may also be used herein to refer to non-volatile mass storage such as physical storage media. If computer system 1600 is distributed, the processing, memory, and/or storage capability may be distributed as well.

Storage system 1610 is shown as including executable instructions 1615. The executable instructions 1615 represent instructions that are executable by the processor(s) the processor system 1605 to perform the disclosed operations, such as those described in the various methods.

The disclosed embodiments may comprise or utilize a special-purpose or general-purpose computer including computer hardware, such as, for example, one or more processors and system memory, as discussed in greater detail below. Embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are "physical computer storage media" or a "hardware storage device." Furthermore, computer-readable storage media, which includes physical computer storage media and hardware storage devices, exclude signals, carrier waves, and propagating signals. On the other hand, computer-readable media that carry computer-executable instructions are "transmission media" and include signals, carrier waves, and propagating signals. Thus, by way of example and not limitation, the current embodiments can comprise at least two distinctly different kinds of computer-readable media: computer storage media and transmission media.

Computer storage media (aka "hardware storage device") are computer-readable hardware storage devices, such as RAM, ROM, EEPROM, CD-ROM, solid state drives ("SSD") that are based on RAM, Flash memory, phase-change memory ("PCM"), or other types of memory, or other optical disk storage, magnetic disk storage or other magnetic storage devices, or any other medium that can be used to store desired program code means in the form of computer-executable instructions, data, or data structures and that can be accessed by a general-purpose or special-purpose computer.

Computer system 1600 may also be connected (via a wired or wireless connection) to external sensors (e.g., one or more remote cameras) or devices via a network 1620. For example, computer system 1600 can communicate with any number devices or cloud services to obtain or process data. In some cases, network 1620 may itself be a cloud network. Furthermore, computer system 1600 may also be connected through one or more wired or wireless networks to remote/separate computer systems(s) that are configured to perform any of the processing described with regard to computer system 1600.

A "network," like network 1620, is defined as one or more data links and/or data switches that enable the transport of electronic data between computer systems, modules, and/or other electronic devices. When information is transferred, or provided, over a network (either hardwired, wireless, or a combination of hardwired and wireless) to a computer, the computer properly views the connection as a transmission medium. Computer system 1600 will include one or more communication channels that are used to communicate with the network 1620. Transmissions media include a network that can be used to carry data or desired program code means in the form of computer-executable instructions or in the form of data structures. Further, these computer-executable instructions can be accessed by a general-purpose or special-purpose computer. Combinations of the above should also be included within the scope of computer-readable media.

Upon reaching various computer system components, program code means in the form of computer-executable instructions or data structures can be transferred automatically from transmission media to computer storage media (or vice versa). For example, computer-executable instructions or data structures received over a network or data link can be buffered in RAM within a network interface module (e.g., a network interface card or "NIC") and then eventually transferred to computer system RAM and/or to less volatile computer storage media at a computer system. Thus, it should be understood that computer storage media can be included in computer system components that also (or even primarily) utilize transmission media.

Computer-executable (or computer-interpretable) instructions comprise, for example, instructions that cause a general-purpose computer, special-purpose computer, or special-purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the embodiments may be practiced in network computing environments with many types of computer system configurations, including personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The embodiments may also be practiced in distributed system environments where local and remote computer systems that are linked (either by hardwired data links, wireless data links, or by a combination of hardwired and wireless data links) through a network each perform tasks (e.g. cloud computing, cloud services and the like). In a distributed system environment, program modules may be located in both local and remote memory storage devices.

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for toggling a visibility of holograms and for correlating tagged spatial data with output of a large language model (LLM), said method comprising:
- accessing scene data describing a real-world scene in which a three-dimensional (3D) object is located;
- accessing a digital file that models the 3D object, wherein the digital file includes tagged spatial data associated with the 3D object;
- receiving, in real time and from a user, user input directed to the 3D object located in the real-world scene;
- providing the scene data, the digital file, and the user input as inputs to an LLM, wherein the LLM is tasked with correlating the user input with the tagged spatial data of the digital file, and wherein the LLM is further tasked with generating a response to the user input; and
- while the LLM's response is being provided to the user, toggling display of a hologram that overlays at least a portion of the 3D object.

2. The method of claim 1, wherein the inputs to the LLM further include a work instruction document, and wherein the LLM's response is further based on the work instruction document.

3. The method of claim 1, wherein the digital file includes a computer-aided design (CAD) file.

4. The method of claim 1, wherein the user input is one or a combination of a verbal input, a gesture input, or an eye gazing input.

5. The method of claim 1, wherein the LLM's response includes a natural language text output, and wherein the natural language text output is converted to an audio output and is played over a speaker to the user.

6. The method of claim 1, wherein the hologram overlays only a specific part of the 3D object as opposed to overlaying an entirety of the 3D object.

7. The method of claim 1, wherein the LLM's response is one or a combination of a visual response, an auditory response, or a haptic response.

8. The method of claim 1, wherein the digital file of the 3D object includes a 3D asset hierarchy associated with the 3D object.

9. The method of claim 1, wherein the LLM identifies multiple instances of the 3D object, and wherein the LLM disambiguates those multiple instances based on additional context obtained for the 3D object.

10. The method of claim 1, wherein multiple holograms, including said hologram, are automatically generated for the 3D object based on the digital file.

11. A method for toggling a visibility of holograms and for correlating tagged spatial data with output of a large language model (LLM), said method comprising:

accessing scene data describing a real-world scene in which a three-dimensional (3D) object is located;

accessing a digital file that models the 3D object, wherein the digital file includes tagged spatial data associated with the 3D object;

receiving, in real time and from a user, user input directed to the 3D object located in the real-world scene, wherein the user input includes a gesture input, wherein a hand-pointing vector is generated based on the gesture input, and wherein the hand-pointing vector is used to determine that the user input is directed to the 3D object;

providing the scene data, the digital file, and the user input as inputs to an LLM, wherein the LLM is tasked with correlating the user input with the tagged spatial data of the digital file, and wherein the LLM is further tasked with generating a response to the user input; and while the LLM's response is being provided to the user, toggling display of a visual cue that overlays at least a portion of the 3D object.

12. The method of claim 11, wherein, as a result of providing the LLM's response and as a result of toggling the display of the visual cue, a comprehensive response is provided to the user who provided the user input, and wherein the comprehensive response includes a language aspect and a physical space aspect.

13. The method of claim 11, wherein the LLM processes the user input to identify specific tagged spatial data from the digital file, the specific tagged spatial data being data that is determined by the LLM to correspond to one or more key terms included in the user input.

14. The method of claim 11, wherein the LLM further consults additional curated files that are identified as being associated with the 3D object, and wherein at least one additional curated file includes a particular curated file that includes sequential usage steps for the 3D object.

15. The method of claim 11, wherein the LLM further consults additional curated files associated with the 3D object, at least one additional curated file includes a parts directory for the 3D object.

16. The method of claim 11, wherein:

the scene data includes data describing a second 3D object included in the real-world scene, the scene data is also included in the inputs to the LLM, and the LLM's response includes details on how the second 3D object is to be used in association with said 3D object, said usage being a part of a procedural work process.

17. The method of claim 11, wherein curating information for the real-world scene is performed based on at least one of the scene data, the digital file, or manual input.

18. A computer system for toggling a visibility of tagged spatial data and for correlating the tagged spatial data with output of a large language model (LLM), said computer system comprising:

a processor system; and a storage system comprising instructions that are executable by the processor system to cause the computer system to:

access scene data describing a real-world scene in which a three-dimensional (3D) object is located, wherein the scene data is tagged with spatial data describing at least the 3D object;

receive, in real time and from a user, user input directed to the 3D object located in the real-world scene, wherein the user input includes a query related to the 3D object;

provide the scene data and the user input as inputs to an LLM, wherein the LLM is tasked with correlating the user input with the tagged spatial data, and wherein the LLM is further tasked with generating a response to the user input; and while the LLM's response is being provided to the user, toggle display of a visual cue that overlays at least a portion of the 3D object.

19. The computer system of claim 18, wherein the spatial data is generated as a result of performing object recognition.

20. The computer system of claim 18, wherein the spatial data is manually entered by a user.

* * * * *